United States Patent
Shim

(10) Patent No.: US 6,660,095 B2
(45) Date of Patent: Dec. 9, 2003

(54) SINGLE WAFER LPCVD APPARATUS

(75) Inventor: Kyung Sik Shim, Songnami-shi (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/046,943

(22) Filed: Jan. 14, 2002

(65) Prior Publication Data

US 2002/0092617 A1 Jul. 18, 2002

(30) Foreign Application Priority Data

Jan. 15, 2001 (KR) .......................................... 2001-2264
Jan. 16, 2001 (KR) .......................................... 2001-2336

(51) Int. Cl.$^7$ ............................................. C23C 16/00
(52) U.S. Cl. ................................. 118/723; 118/723 R
(58) Field of Search ................................. 118/723, 725, 118/723 I, 723 AN, 724; 156/345.43, 345.44, 345.47, 345.48, 345.45, 345.46

(56) References Cited

U.S. PATENT DOCUMENTS

| | | | | |
|---|---|---|---|---|
| 4,732,792 A | * | 3/1988 | Fujiyama | 427/452 |
| 4,836,138 A | | 6/1989 | Robinson et al. | 118/666 |
| 5,648,006 A | | 7/1997 | Min et al. | 219/467 |
| 5,651,827 A | * | 7/1997 | Aoyama et al. | 118/725 |
| 5,779,849 A | * | 7/1998 | Blalock | 156/345.48 |
| 5,894,887 A | * | 4/1999 | Kelsey et al. | 165/80.2 |
| 5,951,772 A | * | 9/1999 | Matsuse et al. | 118/723 R |
| 6,035,101 A | * | 3/2000 | Sajoto et al. | 392/416 |
| 6,287,981 B1 | * | 9/2001 | Kim et al. | 438/729 |
| 6,398,873 B1 | * | 6/2002 | Yun | 118/725 |

FOREIGN PATENT DOCUMENTS

| | | | | |
|---|---|---|---|---|
| EP | 0845546 A2 | * | 3/1998 | C23C/16/46 |
| JP | 08097167 A | * | 4/1996 | H01L/21/22 |
| JP | 08139039 A | * | 5/1996 | H01L/21/205 |

* cited by examiner

*Primary Examiner*—Gregory Mills
*Assistant Examiner*—Michelle Crowell
(74) *Attorney, Agent, or Firm*—Marger Johnson & McCollom, P.C.

(57) ABSTRACT

Disclosed is a single wafer LPCVD apparatus. The single wafer LPCVD apparatus comprises: a vacuum chamber having an upper part sealed by a quartz dome, the vacuum chamber receiving a single wafer loaded therein; a bell jar having a dome-shaped inner wall, covering the quartz dome, and spaced by a selected interval from the quartz dome; a dome-shaped plasma electrode established between the bell jar and the quartz dome; an RF power supply for applying an RF power to the dome-shaped plasma electrode; a thermally insulated wall provided on the entire inner wall of the bell jar; a sheath heater having a heater wire and an insulator for covering the heater wire, the sheath heater being attached and established to a surface of the adiabatic wall in a shape of a coil; and a cooling pipe established in a wall of the bell jar. Temperature uniformity within the vacuum chamber is enhanced and the manufacture of a high-temperature heater for hot processing is unnecessary. A dome-shaped plasma electrode is replaced with the metal tube, so that heat transfer from the sheath heater into the vacuum chamber can be carried out very efficiently as well as inductively coupled plasma can be obtained.

12 Claims, 2 Drawing Sheets

SINGLE WAFER LPCVD APPARATUS

BACKGROUND OF THE INVENTION

1. Field of the Invention

The present invention relates to a single wafer LPCVD apparatus, and more particularly, to a single wafer LPCVD apparatus which adopts a direct heating technique, thereby enabling hot processing, uniform temperature distribution within a space in a vacuum chamber and plasma processing as well.

2. Description of the Related Art

In general, a batch-type Chemical Vapor Deposition (CVD) has been carried out in order to improve the yield of thin film deposition. In the batch-type CVD, multiple wafers are loaded into a single reaction tube. However, since wafers are closely and vertically arranged in such the batch-type CVD, reaction gases fail to sufficiently contact with some portions of the wafers, which is detrimental to the uniformity of thin film deposition.

In order to solve such a problem, a Low Pressure Chemical Vapor Deposition (LPCVD) was proposed. Different from a conventional Atmospheric Pressure Chemical Vapor Deposition (APCVD) in which a thin film is deposited in the vicinity of the atmospheric pressure, the LPCVD carries out thin film deposition at a pressure ranging from 0.1 to 50 torr. In the LPCVD, a CVD is carried out under a low pressure as set forth above, and thus the mean free path of reaction gases becomes long. Therefore, the reaction gases sufficiently flow through the wafers even in a batch-type LPCVD, thereby improving the uniformity of thin film deposition as well as the step coverage. As a result, contact holes or trenches can be filled without pores.

Therefore, the LPCVD is mainly used in a practical semiconductor device manufacturing process due to the foregoing merits although the film deposition rate thereof is lower than the APCVD.

The recent trend of using larger wafers has replaced the batch-type LPCVD with a single wafer LPCVD in order to further improve the uniformity of film deposition and the step coverage. In the single wafer LPCVD, a single wafer is loaded into the reaction chamber.

FIG. 1 is a schematic view illustrating a conventional single wafer LPCVD apparatus.

Referring to FIG. 1, a vacuum chamber (not shown in the drawing) is covered with a quartz dome 20 and thereby it is sealed. The quartz dome 20 is covered with a bell jar 30. Between the bell jar 30 and the quartz dome 20 is installed a dome-type plasma electrode 40, which is applied with Radio Frequency (RF) power from an RF power supply 50 to generate plasma within the quartz dome 20.

Along the side wall of the bell jar 30 are vertically installed an insulation wall 34 and an adiabatic wall 32 which is placed outer from the insulation wall 34. Between the adiabatic wall 32 and the insulation wall 34 is installed a heater wire 36 wound around the insulation wall 34 in the shape of a coil. The adiabatic wall 32 prevents heat radiated from the heater wire 36 from being transferred to the outside. Current flows through the heater wire 36 during heat generation because the heater wire 36 generates heat by electric resistance. Therefore, the insulation wall 34 is installed to prevent RF noises generated in the dome-type plasma electrode 40 from being transferred to the heater wire 36.

As described above, the conventional single wafer LPCVD apparatus has a vertical overall configuration with the heater wire 36 winding around the side of the quartz dome 20. Therefore, the distance between the heater wire 36 and the quartz dome 20 gradually increases from a shoulder of the quartz dome 20, and there is no heater wire 30 at all over the quartz dome 20. Therefore, the temperature distribution is nonuniform within the vacuum chamber, and the heater wire should be adjusted up to a very high temperature when a hot processing is required. The heater wire capable of stably enduring such a hot processing can be barely prepared, and the cost thereof is very high.

SUMMARY OF THE INVENTION

Accordingly, the present invention has been devised to solve the foregoing problems of the prior art, and it is therefore an object of the invention to provide a single wafer LPCVD apparatus which adopts a direct heating technique rather than an indirect heating technique of the prior art, thereby enabling hot processing, uniform temperature distribution within a space in a vacuum chamber and plasma processing as well.

To accomplish the above object and other advantages, there is a single wafer LPCVD apparatus. The apparatus comprises: a vacuum chamber having an upper part sealed by a quartz dome, the vacuum chamber receiving a single wafer loaded therein; a bell jar having a dome-shaped inner wall, covering the quartz dome, and spaced by a selected interval from the quartz dome; a dome-shaped plasma electrode established between the bell jar and the quartz dome; an RF power supply for applying an RF power to the dome-shaped plasma electrode; an adiabatic wall provided on the entire inner wall of the bell jar; a sheath heater having a heater wire and an insulator for covering the heater wire, the sheath heater being attached and established to a surface of the adiabatic wall in a shape of a coil; and a cooling pipe established in a wall of the bell jar.

According to another aspect of the invention, there is a single wafer LPCVD apparatus. The apparatus comprises: a vacuum chamber with an upper part sealed by a quartz dome, the vacuum chamber receiving a single wafer loaded therein; a bell jar having a dome-shaped inner wall, covering the quartz dome, and spaced by a selected interval from the quartz dome; an adiabatic wall provided on the entire inner wall of the bell jar; a sheath heater having a heater wire and an insulator for covering the heater wire, the sheath heater being applied to a surface of the adiabatic wall in a shape of a coil; a metal tube functioning as a plasma electrode and surrounding the nonconductor of the sheath heater; an RF power supply for applying an RF power to the metal tube; and a cooling pipe provided in a wall of the bell jar.

DETAILED DESCRIPTION OF THE PREFERRED EMBODIMENT

The following detailed description will present preferred embodiments of the invention in reference to the accompanying drawings.

Figure 1:
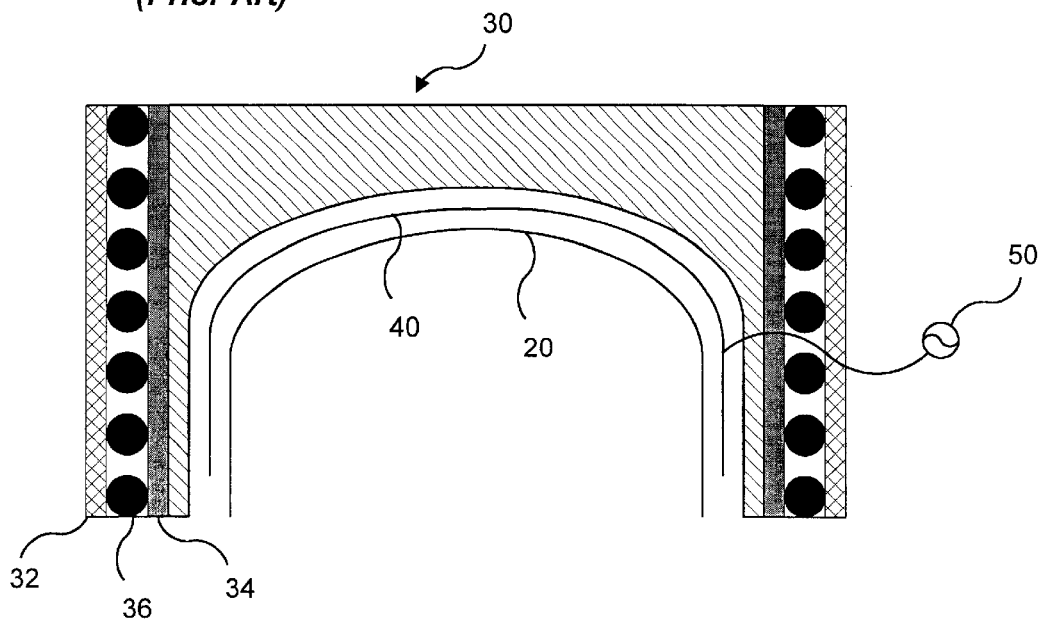
FIG. 1 is a schematic view illustrating a conventional single wafer LPCVD apparatus.
Figure 2:
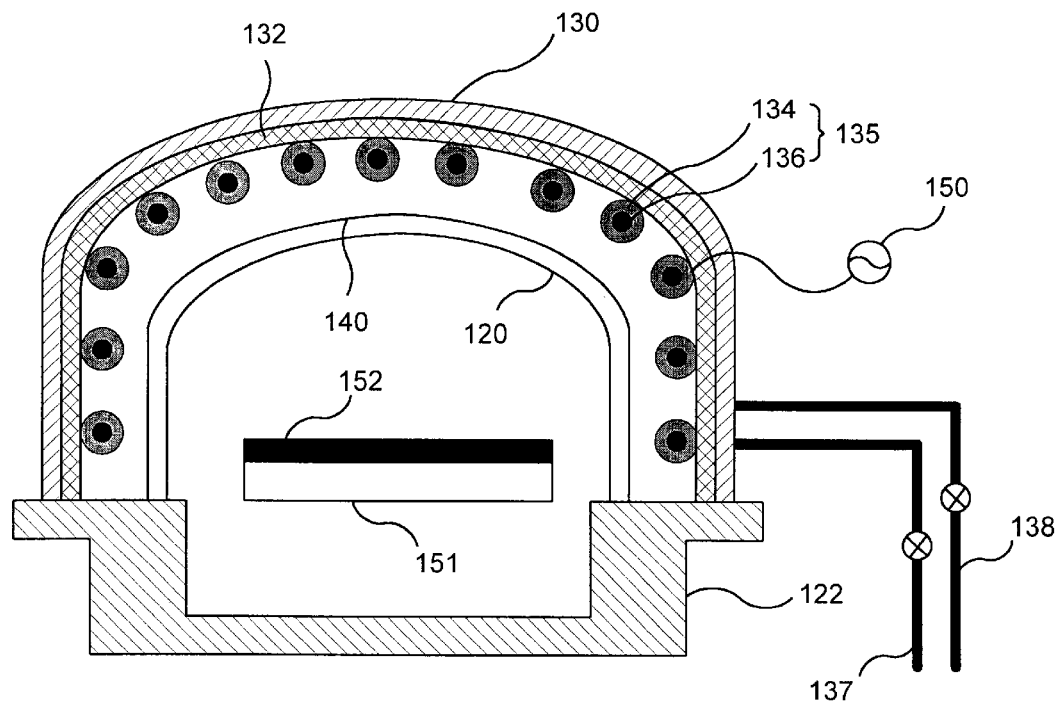
FIG. 2 is a schematic view illustrating a single wafer LPCVD apparatus in accordance with the first embodiment of the invention.

FIG. 2 is a schematic view illustrating a single wafer LPCVD apparatus in accordance with the first embodiment of the invention.

Referring to FIG. 2, a vacuum chamber 122 is comprised of a lower chamber 122 and a quartz dome 120. The lower chamber 122 is opened at the upper portion thereof, which is covered by the quartz dome 120. Inside the vacuum chamber 122 is installed a wafer pedestal 151 on which a wafer 152 is loaded. Inside the wafer pedestal 151 is installed a heater (not shown) for heating the wafer 152.

The quartz dome 120 is covered by the bell jar 130, which has an inner wall having the same domy configuration as the quartz dome 120. The inner wall of the bell jar 130 is spaced from the quartz dome 120 by a predetermined gap, in which a dome-shaped plasma electrode 140 is installed between the bell jar 130 and the quartz dome 120. The dome-shaped plasma electrode 140 is applied with RF power from an RF power supply 150 to generate plasma within the quartz dome 120.

An adiabatic wall 132 is established on the entire inner wall of the bell jar 130. Inside the adiabatic wall 132 is established a sheath heater 135. In the wall of the bell jar 130 is installed a cooling pipe (not shown) having an inlet 137 and an outlet 138 of cooling water. The cooling pipe serves to prevent heat generated from the sheath heater 135 from being transferred to the outside, and is to enhance the yield of processing and the safety of an operator. The cooling pipe may be installed either in the wall of the bell jar 130 or on the outer face of the wall.

The sheath heater 135 is shaped as a coil wound around the quartz dome 120 in a lateral direction, and constituted of a heater wire 136 and an insulator 134 for covering the heater wire 136. The insulator 134 is required to transmit infrared rays from the heater wire 136, and for instance, it preferably includes MgO. Noises generated from the dome-shaped plasma electrode 140 are shielded by the insulator 134, and are not transferred to the heater wire 136.

In accordance with the invention, since the sheath heater 130 is installed in the domy configuration as the quartz dome 120, heat is uniformly transferred to a space under the quartz dome 120, thereby enhancing temperature uniformity in the vacuum chamber over the prior art.

The heater was installed far from the shoulder of the quartz dome in the prior art. Whereas, in accordance with the invention, the overall sheath heater 135 is installed adjacent to the quartz dome 120 to enhance heating efficiency. In particular, the nonconductor 134 shields the noises from the dome-shaped plasma electrode 140, so that the sheath heater 135 can be installed very adjacent to the dome-shaped plasma electrode 140 thereby further enhancing such heating efficiency. Therefore, it is unnecessary to heat the heater inside the wafer pedestal 151 up to a high temperature. Further, it is unnecessary to separately manufacture a high-temperature heater for hot processing.

Figure 3:
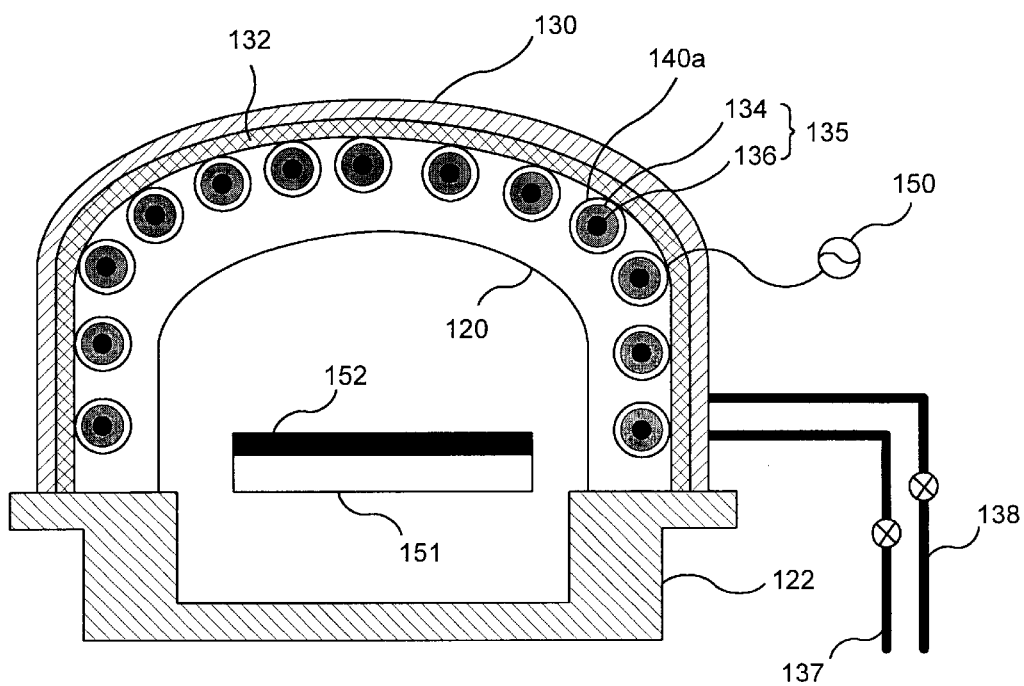
FIGS. 3 and 4 are schematic views illustrating a single wafer LPCVD apparatus in accordance with the second embodiment of the invention.
Figure 4:
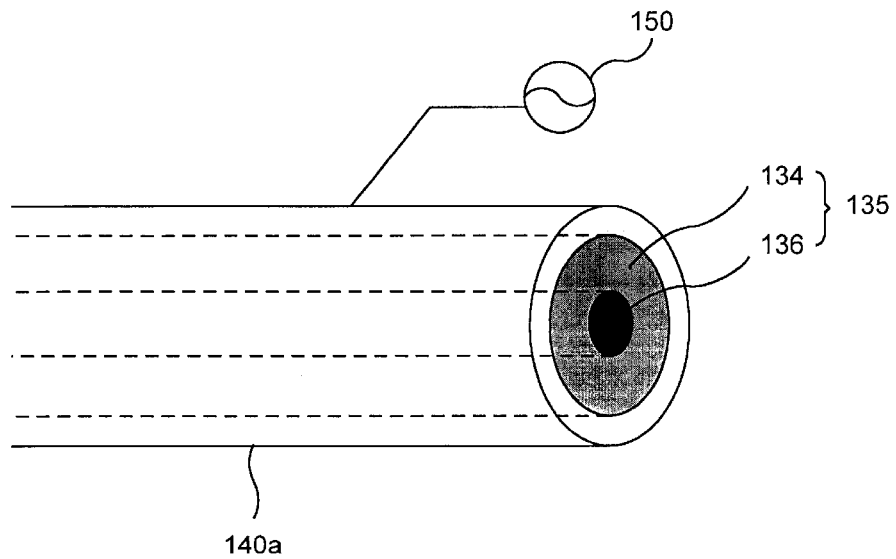

FIGS. 3 and 4 are schematic views illustrating a single wafer LPCVD apparatus in accordance with the second embodiment of the invention. The same reference numerals as in FIG. 2 are used throughout FIGS. 3 and 4 to designate those components performing the same functions, and repetitive description thereof will be omitted for the sake of brevity.

Referring to FIGS. 3 and 4, the single wafer LPCVD apparatus in accordance with the second embodiment of the invention has the same configuration and components as that in FIG. 2 except that the dome-shaped plasma electrode 140 is replaced with a metal tube 140a functioning as a plasma electrode. The metal tube 140a is installed to surround an insulator 134 of a sheath heater 135. Usable examples of the metal tube 140a may include a stainless steel tube. Noises from the metal tube 140a are shielded by the insulator 134, and are not transferred to the heater wire 136.

When the dome-shaped plasma electrode 140 is used, heat of the sheath heater 135 may be insufficiently transferred into the inside of the vacuum chamber shielded by the dome-shaped plasma electrode 140. Such a problem can be avoided in accordance with the second embodiment of the invention. Further, the metal tube 140a is arranged to surround the quartz dome 120 into the shape of a coil along the sheath heater 135, so that inductively coupled plasma is generated rather than capacitively coupled plasma, resulting in uniform and high-density plasma.

In the single wafer LPCVD apparatus in accordance with the invention as described hereinbefore, the temperature uniformity within the vacuum chamber is enhanced and the manufacture of the high-temperature heater for hot processing is unnecessary. The contour of the bell jar can be dome-shaped differently from the prior art, so that the volume and mass of the bell jar can be reduced. When the metal tube surrounding the sheath heater is used as the plasma electrode instead of the dome-shaped plasma electrode, heat transfer from the sheath heater into the vacuum chamber is carried out very efficiently while inductively coupled plasma is obtained. Excellent process efficiency can be achieved because inductively coupled plasma is higher in density than capacitively coupled plasma.

Although the preferred embodiments of the present invention have been disclosed for illustrative purposes, those skilled in the art will appreciate that various modifications, additions and substitutions can be made without departing from the scope and spirit of the invention as defined in the accompanying claims.

What is claimed is:

1. A LPCVD apparatus comprising:
    a vacuum chamber having an upper part sealed by a sealing dome, the vacuum chamber for receiving a wafer therein;
    a bell jar having a dome-shaped inner wall, for covering the sealing dome, and spaced apart from the sealing dome;
    a thermally-insulated wall provided on the inner wall of the bell jar, the thermally-insulated wall having a dome shape conformal to the shape of the inner wall of the bell jar;
    a sheath heater having a heater wire and an insulator for covering the heater wire, the sheath heater located below the thermally-insulated wall and having a dome-shape configuration to enhance temperature uniformity in the vacuum chamber; and
    a dome-shaped plasma electrode located below the sheath heater, and between the bell jar and the sealing dome.

2. The apparatus of claim 1, wherein the insulator of the sheath heater is made of MgO.

3. LPCVD apparatus comprising:
    a vacuum chamber with an upper part sealed by a sealing dome, the vacuum chamber for receiving a wafer therein;
    a bell jar having a dome-shaped inner wall, covering the sealing dome, and spaced apart from the sealing dome;
    a thermally-insulated wall provided on the inner wall of the bell jar, thermally insulated wall having a dome shape conformal to the shape of the inner wall of the bell jar;

a sheath heater having a heater wire and an insulator for covering the heater wire, the sheath heater disposed below the thermally-insulated wall and having a dome-shape configuration conformal to the shape of the thermally insulated wall to enhance temperature uniformity in the vacuum chamber; and a metal tube functioning as a plasma electrode and surrounding the insulator of the sheath heater.

4. The apparatus of claim 3, wherein the insulator of the sheath heater is made of MgO.

5. The apparatus of claim 3, wherein the metal tube is made of stainless steel.

6. The apparatus of claim 3, further comprising an RF power supply for applying an RF power to the metal tube.

7. The apparatus of claim 3, further comprising a cooling pipe provided in a wall of the bell jar.

8. The apparatus of claim 3, wherein the metal tube is arranged into the shape of a coil along the sheath heater so that inductively coupled plasma is generated rather than capacitively coupled plasma to generate uniform and high-density plasma.

9. The apparatus of claim 1, further comprising an RF power supply for applying an RF power to the dome-shaped plasma electrode.

10. The apparatus of claim 1, further comprising a cooling pipe provided in a wall of the bell jar.

11. The apparatus of claim 1, wherein the heater is shaped as coil wound around the sealing dome.

12. The apparatus of claim 1, wherein the configuration of the sheath heater is conformal to the shape of the thermally-insulated wall having a dome shape.

* * * * *

UNITED STATES PATENT AND TRADEMARK OFFICE
CERTIFICATE OF CORRECTION

PATENT NO. : 6,660,095 B2  
DATED : December 9, 2003  
INVENTOR(S) : Shim

It is certified that error appears in the above-identified patent and that said Letters Patent is hereby corrected as shown below:

Title page,
Item [57], ABSTRACT,
Line 9, "eletrode; a thermally insulated wall"
should read -- electrode; an adiabatic wall --.

Column 4,
Line 46, "the inner wall of the bell jar;" should read -- the inner well; --.
Line 66, "the inner wall of the bell jar;" should read -- the inner wall; --.

Signed and Sealed this

Twenty-ninth Day of June, 2004

JON W. DUDAS  
*Acting Director of the United States Patent and Trademark Office*